United States Patent [19]

Asars

[11] Patent Number: 4,891,597

[45] Date of Patent: Jan. 2, 1990

[54] SYNCHRONOUS DETECTION AND LOCATION OF INSULATION DEFECTS

[75] Inventor: Juris A. Asars, Murrysville Boro, Pa.

[73] Assignee: Westinghouse Electric Corp., Pittsburgh, Pa.

[21] Appl. No.: 267,138

[22] Filed: Nov. 4, 1988

[51] Int. Cl.⁴ ............................................. G01R 31/12
[52] U.S. Cl. ..................................... 324/557; 324/514; 324/531; 324/541; 324/544
[58] Field of Search ................ 324/559, 557, 558, 541, 324/544, 551, 514, 501, 512, 527, 531, 452, 456; 340/647, 651

[56] References Cited

U.S. PATENT DOCUMENTS

| | | | |
|---|---|---|---|
| 2,044,424 | 6/1936 | Edwards et al. | 324/541 |
| 2,942,181 | 6/1960 | Edwards et al. | 324/514 |
| 3,096,478 | 7/1963 | Brown | 324/514 |
| 3,131,347 | 4/1964 | Brooks et al. | 324/514 |
| 3,263,165 | 7/1966 | Eigen | 324/514 |
| 3,421,076 | 1/1969 | Eigen | 324/544 |
| 3,440,528 | 4/1969 | Anderson | 324/533 |
| 3,515,986 | 6/1970 | Peschel | 324/544 |
| 3,612,994 | 10/1972 | Hooper | 324/514 |
| 3,639,831 | 2/1972 | Cushman | 324/459 |
| 3,968,426 | 7/1976 | Ward, Jr. et al. | 324/541 |
| 3,990,003 | 11/1976 | Agee, Jr. et al. | 324/531 |
| 4,296,372 | 10/1981 | Feuerbaum | 324/71.3 |
| 4,422,034 | 12/1983 | Matsuno et al. | 324/541 |
| 4,517,510 | 5/1985 | Clinton | 324/514 |

Primary Examiner—Gerard R. Strecker
Assistant Examiner—Robert W. Mueller

[57] ABSTRACT

A method and device for detecting defects in wire or cable insulation without disconnecting the cable by synchronously detecting the current in a sense conductor with respect to the potential waveform existing or imposed on the cable under test. Both the ion source and the sense conductor are placed in close proximity to the cable under test. The current flowing in the sense conductor due to the ions from the ion source varies depending upon the presence of defects in the cable insulation and the potential waveform present on the cable under test. The synchronous detection enhances the signal to noise ratio of the current measurement.

16 Claims, 1 Drawing Sheet 4,891,597

SYNCHRONOUS DETECTION AND LOCATION OF INSULATION DEFECTS

GOVERNMENT RIGHTS

The invention disclosed herein was made under Government Contract No. F 30602-86-C-0264. The Government may have rights in this invention.

FIELD OF THE INVENTION

The present invention relates to the methods and devices used to detect defects in the insulation around wires and cables. More particularly it relates to an insulation defect detector which utilizes synchronous detection.

BACKGROUND OF THE INVENTION

In certain situations and circumstances it is important to know if the insulation surrounding a wire or cable has deteriorated. Such deterioration could be a precursor to a failure in an important system. For example, in jet fighter aircraft, wire chaffing and the resulting deterioration of the insulation are often precursors to failure. If the chaffing continues undetected, the cable may be severed or shorted to another cable with catastrophic results depending on the purpose of the cable. If the cable is used to control the rudder or aileron, severing or shorting that cable could result in a loss of control of the aircraft and possibly a fatal crash. It would be desirable therefore to have a method and device for detecting the deterioration and failure of wire insulation. If insulation defects and deterioration are detected in a timely manner, the wire or cable could be replaced before a catastrophic failure occurs.

U.S. Pat. No. 3,096,478 discloses an apparatus for detecting non-uniformity in electrically insulated wires through the use of conductive gas electrodes. The electrodes consist of a tube or sleeve containing ionized air which establishes a direct current path through the defective insulation segment. In the apparatus disclosed in this patent, the cable must be placed inside the conductive gas electrode. Similarly, the cable must be placed inside the nonconducting tube containing a semiconducting ionized gas to test the insulation in the apparatus described in U.S. Pat. No. 3,263,165. The methods and devices of evaluating wire insulation disclosed in these two references require the measurement of very small currents in the conductor of the cable under test. They require that the equipment normally connected to the cables under evaluation be inoperative and that the cables be disconnected from the equipment in most cases. Such requirements considerably limit the number of applications where such cable insulation evaluation methods and devices can be used.

U.S. Pat. No. 3,639,831 discloses a method and apparatus for producing a directable, electrically conducting gas jet and detecting the presence of anomalies therein caused by insulators, conductors or semi-conductors. The gas jet flows across a test zone and impinges upon a target anode which is maintained at a bias potential with respect to the cathode of the ionizing generator such as to cause an electrical current to flow between the anode and the cathode via the gas jet across the test zone. This device requires that the electrical current flow between the gas jet nozzle and the target anode be constant. Moreover, there is no provision for measuring anomalies which have their own potential or are carrying a current.

It would be desirable therefore if an insulation integrity evaluation could be performed while the equipment connected to the cables under test were not disconnected or were operating and the normal potential waveforms were present on the conductors.

SUMMARY OF THE INVENTION

Generally, the present invention provides for the synchronous detection of defects or faults in insulation through the use of one or more sense conductors. Preferably, the sense conductors could be included in cables for which future insulation evaluation is anticipated or they could be placed along side an existing cable at the time of an insulation integrity test. Also placed along side or in close proximity to the cable under test is an ion source which generates a plurality of gas ions. The presence of an ionized gas stream or an ionized gas cloud around the sense conductor causes an electrostatic field which causes a current to flow in the sense conductor which can be measured by a current measuring device. This electrostatic field, in turn, is affected by the condition of the insulation on any adjacent cable which has a potential waveform. The synchronous detection of the current in the sense conductor with respect to an existing or imposed potential waveform on the cable under test provides a means for evaluating its insulation condition in the presence of an ion source. This can easily be done by multiplying the sense current measurement by the potential waveform on the cable under test and averaging the result over a period of time which is greater than the frequency of the potential or current waveforms. Alternatively, the current flowing in the sense conductor due to the ions from the ion source can be measured as a function of the position of the ion source along the cable and as a function of the position of the defect in the insulation of the cable.

Other details, objects and advantages of the present invention will become more readily apparent from the following description of a presently preferred embodiment thereof.

BRIEF DESCRIPTION OF THE DRAWINGS

In the accompanying drawings, a preferred embodiment of the present invention is illustrated, by way of example only, wherein.

DESCRIPTION OF THE PREFERRED EMBODIMENT

Figure 1:
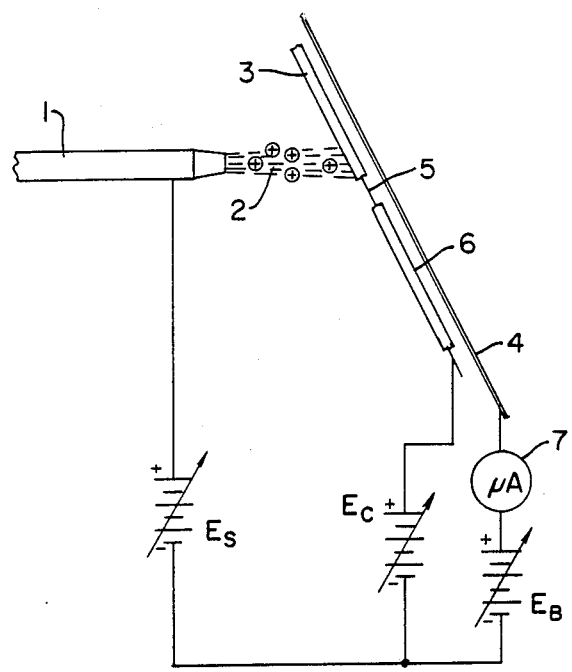
FIG. 1 shows an embodiment of the present invention using a moveable ion source.

FIG. 1 shows one embodiment of the present invention using a moveable ion source 1 which produces an ionized gas stream 2. The ions in the gas stream can be generated using any number of known methods including radioactive materials, electrically induced ionization or thermally induced ionization. The ion source is positioned in close proximity to the insulated cable or wire 3 under test, preferably within two inches. The cable 3 preferably has its normal potential waveform on it. A separate sense conductor 4 is also located in close proximity to the cable 3 under test.

The ionized gas stream 2 due to the voltage $E_s$ of the ion source causes a current to flow in the sense conductor 4. The direct component of the current in the sense conductor 4 is measured as a function of the potential waveform on the cable under test. A change in the measured current occurs when the ions pass over a defect 5 in the insulation 6 of the cable 3. By moving the ion source along the cable 3, the direct current is also measured as a function of its position along the cable and this information can be used to locate the defects which are detected.

While the presence or absence of insulation defects generally can be established just by measuring the current in the sense conductor, by synchronously measuring the current in the sense conductor with respect to a potential waveform on the cable under test results not only in enhanced detectability of the defects but also an easier overall test since the cable can remain in operation. This synchronous detection of sense conductor current with respect to a potential waveform $E_C$ on the cable under test also enhances the signal to noise ratio of the current measurement in the sense conductor, typically made by microammeter 7. It also provides a means for identifying which cable has the defective insulation in the case of multiconductor cables if different potential waveforms exist or are placed on the different cables and the sense conductor current is synchronously detected with respect to each potential waveform. The sensitivity of the current measurement is improved if a bias potential $E_B$ is added to the sense conductor.

Figure 2:
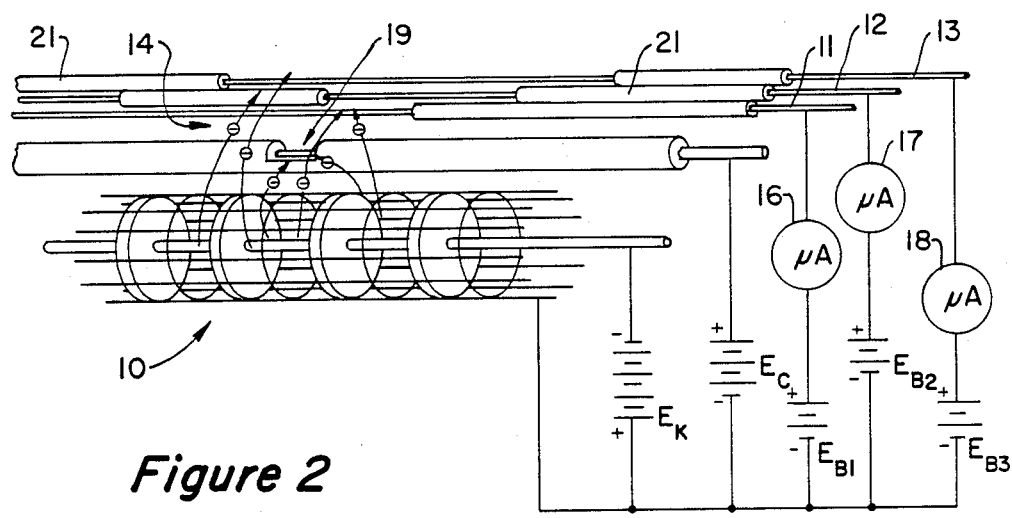
FIG. 2 shows an embodiment of the present invention using an extended ion source.

A variety of different ion sources can be used including the extended ionized gas source 10 shown in FIG. 2. This ion source is described in U.S. patent application Ser. No. 07/267,150, filed Nov. 4, 1988 which is incorporated herein by reference as if set forth in full. The direct current flowing in each of the plurality of sense conductors 11, 12 and 13 is measured as a function of the potential $E_c$ on the insulated conductor 15 under test. In this case, a d.c. or a high frequency a.c. voltage $E_K$ is used to excite the ion source 10 and to generate a corona discharge or ion cloud 14 which provides the current flowing to and in the sense conductors. The current in each sense conductor is detected by microammeters 16, 17 and 18, respectively, synchronously with respect to the potential waveform $E_c$ on the insulated conductor 15 under test to identify if there are any defects 19 in the insulation 20. The location of the defect 19 along the length of the conductor 15 can be obtained by using a plurality of sense conductors each coded (such as with Grey code) with insulation segments 21 as shown in FIG. 2. Additionally, bias potentials $E_{B1}$, $E_{B2}$ and $E_{B3}$ can be used with each sense conductor to improve its sensitivity.

EXAMPLE

Table 1 provides some data showing the change in the measured current in the sense conductor for the device shown in FIG. 1. A 3M 902 ionized air gun with nitrogen gas (flow constant but not measured) was used as the ion source. A bare sense conductor (0.05 inch diameter) was placed parallel to an insulated (0.012 inch thick Teflon TM insulation) cable under test (0.05 inch diameter) with a 0.25 inch separation between them. Both the cable and the sense conductor were spaced 0.5 inches in front of either a conductive or insulating background, and the ionized air gun was placed 0.9 inches from them with the gas stream perpendicular to the background plane. The defect consisted of a 0.08 inch long insulation segment removed from the insulated cable under test. The steady state sense conductor current in millimicroamperes was measured with an HP Model 425A d.c. Microammeter while both voltages $E_s$ and $E_b$ were held at zero.

TABLE 1

| $E_c$ (Volts) | Sense Conductor Current (μA) | | | |
|---|---|---|---|---|
| | No Defect[1] | Defect | No Defect[2] | Defect |
| +200 | 0.07 | 0.25 | 0.21 | 0.52 |
| +100 | 0.06 | 0.16 | 0.18 | 0.36 |
| 0 | 0.04 | 0.04 | 0.14 | 0.14 |
| −100 | 0.02 | −0.06 | 0.13 | −0.04 |
| −200 | 0.00 | −0.15 | 0.08 | −0.20 |

[1]Conductive Background
[2]Insulating Background

While a presently preferred embodiment of practicing the invention has been shown and described with particularity in connection with the accompanying drawings, the invention may otherwise be embodied within the scope of the following claims.

What is claimed:

1. An insulation defect detector comprising an ion source which generates a plurality of gas ions; an insulated cable under test which has a potential waveform thereon; a sense conductor connected to a measuring device which synchronously measures the current flowing in the sense conductor due to the gas ions from the ion source as a function of the potential waveform on the insulated cable to detect the presence of a defect in the insulated cable.

2. The insulation defect detector as described in claim 1 wherein the ion source is moveable with respect to the cable under test.

3. The insulation defect detector as described in claim 2 wherein a plurality of coded sense conductors are used to more accurately locate where on the cable under test a defect occurs.

4. The insulation defect detector as described in claim 4 wherein a plurality of cables are simultaneously under test and each cable has a different potential waveform thereon.

5. The insulation defect detector as described in claim 1 wherein the ion source is an extended ion source which is scanned such that the generation of the plurality of gas ions propagates along the ion source.

6. The insulation defect detector as described in claim 1 wherein a bias voltage is applied to the sense conductor.

7. A method for detecting defects in an insulated cable having a potential waveform thereon utilizing an ion source and a sense conductor comprising the steps of:
   (a) placing the ion source and the sense conductor in close proximity to the insulated cable;
   (b) using the ion source to generate a stream of gas ions which flows over the insulated cable and to the sense conductor;
   (c) causing the stream of gas ions to move along the cable; and
   (d) synchronously measuring the current in the sense conductor with respect to the potential waveform on the insulated cable to individually detect each defect therein.

8. The method as described in claim 7 further comprising the step of biasing the sense conductor.

9. The method as described in claim 7 wherein the ion source is placed substantially perpendicular to the insulated cable and is moveable along the cable.

10. The method as described in claim 7 wherein the ion source is an extended ion source placed substantially parallel to the insulated cable which generates gas ions along its entire length and wherein a plurality of coded sense conductors are placed along the cable and the current in each one is synchronously measured with respect to the potential waveform on the insulated cable so as to individually detect each insulation fault.

11. The method as described in claim 7 wherein the ion source is a scanned extended ion source wherein the ion gas cloud propagates along its length.

12. The method as described in claim 7 wherein a plurality of insulated cables are tested simultaneously provided each insulated cable has a different potential waveform thereon.

13. An insulation defect detector comprising an ion source which generates a plurality of gas ions; an insulated cable under test; and a sense conductor connected to a measuring device which detects current flowing in the sense conductor due to the gas ions from the ion source as a function of the position of the ion source along the cable under test and with respect to the position of a defect in the insulation of the cable under test.

14. The insulation defect detector as described in claim 13 wherein the ion source is moveable with respect to the cable under test.

15. The insulation defect detector as described in claim 13 wherein the ion source is an extended ion source which is scanned such that the generation of the plurality of gas ions propagates along the ion source.

16. The insulation defect detector as described in claim 13 wherein a bias voltage is applied to the sense conductor.

* * * * *